United States Patent
Regolini et al.

(10) Patent No.: US 8,410,570 B2
(45) Date of Patent: Apr. 2, 2013

(54) PHOTODIODE WITH INTERFACIAL CHARGE CONTROL AND ASSOCIATED PROCESS

(75) Inventors: Jorge Regolini, Bernin (FR); Michael Gros-Jean, Grenoble (FR)

(73) Assignees: STMicroelectronics S.A., Montrouge (FR); STMicroelectronics (Crolles 2) SAS, Crolles (FR)

( * ) Notice: Subject to any disclaimer, the term of this patent is extended or adjusted under 35 U.S.C. 154(b) by 328 days.

(21) Appl. No.: 12/781,489

(22) Filed: May 17, 2010

(65) Prior Publication Data
US 2010/0289106 A1    Nov. 18, 2010

(30) Foreign Application Priority Data

May 18, 2009 (FR) ...................................... 09 53288

(51) Int. Cl.
*H01L 21/00* (2006.01)
*H01L 31/0232* (2006.01)
*H01L 31/06* (2006.01)

(52) U.S. Cl. .......... 257/436; 257/461; 257/463; 438/44; 438/45

(58) Field of Classification Search .................... 438/44, 438/45; 257/436, 461, 463
See application file for complete search history.

(56) References Cited

U.S. PATENT DOCUMENTS

| | | | |
|---|---|---|---|
| 6,930,336 B1 * | 8/2005 | Merrill | 257/292 |
| 7,800,147 B2 | 9/2010 | Adkisson et al. | |
| 2005/0151218 A1 | 7/2005 | Mouli | |
| 2006/0145202 A1 * | 7/2006 | Sawase et al. | 257/291 |
| 2007/0158771 A1 | 7/2007 | Hynecek | |
| 2008/0191307 A1 * | 8/2008 | Darwish | 257/493 |
| 2009/0230496 A1 * | 9/2009 | Takimoto | 257/444 |
| 2009/0267078 A1 * | 10/2009 | Mishra et al. | 257/76 |
| 2010/0025730 A1 * | 2/2010 | Heikman et al. | 257/194 |

OTHER PUBLICATIONS

French Search Report, FR 0953288, Apr. 6, 2010, 3 pages.
Park et al., "Deep Trench Isolation for Crosstalk Suppression in Active Pixel Sensors with 1.7 um Pixel Pitch" Japanese Journal of Applied Physics, vol. 46, No. 4B, 2007, pp. 2454-2457.

* cited by examiner

*Primary Examiner* — Fernando L Toledo
*Assistant Examiner* — Karen Kusumakar
(74) *Attorney, Agent, or Firm* — Gardere Wynne Sewell LLP

(57) ABSTRACT

A photodiode includes a first doped layer and a second doped layer that share a common face. A deep isolation trench has a face contiguous with the first and second doped layers. A conducting layer is in contact with a free face of the second doped layer. A protective layer is provided at an interface with the first doped layer and second doped layer. This protective layer is capable of generating a layer of negative charge at the interface. The protective layer may further be positioned within the second doped layer to form an intermediate protective structure.

18 Claims, 4 Drawing Sheets

*(PRIOR ART)*

PHOTODIODE WITH INTERFACIAL CHARGE CONTROL AND ASSOCIATED PROCESS

PRIORITY CLAIM

This application claims priority from French Application for Patent No. 09 53288 filed May 18, 2009, the disclosure of which is hereby incorporated by reference.

TECHNICAL FIELD

The invention relates to the field of photodiodes and more particularly to photodiodes produced in matrices.

BACKGROUND

Photodiode technology relies on two key parameters.

The first parameter is the sensitivity of the photodiode, which represents the capacity of the photodiode to collect photogenerated charge carriers. This parameter controls the intensity of the current generated for a given illumination.

The second parameter is the dark current, which represents the current flowing through the photodiode when no light illuminates the photodiode. This parameter controls the difference in intensity of the current generated for a given difference in illumination.

A relatively large portion of the electrons generated in the photodiode do not contribute to the photocurrent as they are trapped by structural defects or recombination zones.

In the case of photodiode matrix sensors, deep isolation trenches are employed so as to limit the neighboring effects. However, deep isolation trenches may play a similar role to structural defects or recombination centers. This is because deep isolation trenches generally comprise an insulating material and are produced in a semiconductor medium. Moreover, an inherent property to silicon/oxide or silicon/nitride interfaces is to have a positive surface charge capable of attracting the photogenerated electrons. It will therefore be understood that deep isolation trenches act as traps for the photogenerated electrons.

A number of studies have been carried out addressing problems of the interface between insulator and semiconductor, particularly in structures similar to photodiodes. The following documents will be considered in order to illustrate the prior art.

The document "SiN/SiC:H passivation layers for p and n type Si wafers", by U. Coscia et al., Thin Solid Films, 516, 1569 (2008), the disclosure of which is hereby incorporated by reference, describes the effects of surface charges of certain materials used for passivation in microelectronics. In particular, the following structures are mentioned: Al/SiN$_x$/Si; Al/a-SiC$_x$:H/Si; and Al/SiN$_x$/a-SiC$_x$:H/Si.

As may be seen, the deep isolation trenches may have recombination effects, in which the photogenerated electrons and the charges at the interface between the deep isolation trenches and the silicon in a photodiode recombine.

The document "Development of robust interfaces based on crystalline γ-Al$_2$O$_3$(001) for subsequent deposition of amorphous high-κ oxides" by C. Merckling et al., Microelectronics Engineering, 84, 2243-6 (2007), the disclosure of which is hereby incorporated by reference, describes processes for the growth of crystalline γ-Al$_2$O$_3$ structures intended for the subsequent growth of high-κ oxides.

The document "Evidence of a high density of fixed negative charges in an insulation layer compound of SI" by D. Konig et al., Thin Solid Films 285, 126 (2001), the disclosure of which is hereby incorporated by reference, describes the formation of a structure capable of generating a negative bias effect in a silicon structure. In particular, it mentions the effect of associating a layer of aluminum fluoride/silicon dioxide alloy on silicon which makes it possible for negative charges at the interface between the two layers of materials to appear.

Thus, it may be seen that there are materials capable of creating a layer of negative charge at the interface with silicon.

There is therefore a need to have a production process for minimizing or eliminating the trapping of photogenerated electrons near deep isolation walls.

There is also a need for a device of the photodiode type in which the trapping of the photogenerated electrons near the deep isolation walls is minimized or eliminated.

SUMMARY

According to a first aspect, a photodiode comprises a first doped layer and a second doped layer that have a common face, at least one deep isolation trench having a face contiguous with the first doped layer and the second doped layer, and a free face of the second doped layer is in contact with a conducting layer. The photodiode thus defined includes at least one deep isolation trench which is provided, on its surface, with a protective layer capable of generating a layer of negative charge at the interface between, on one side, the first doped layer and the second doped layer and, on the other side, the deep isolation trench.

The photodiode may moreover include an intermediate protective layer at least partly located in the second doped layer, said intermediate protective layer being capable of generating a layer of negative charge at the interface with the second doped layer.

The thickness of the intermediate protective layer may be between 5 nm and 20 nm.

The intermediate protective layer may be made of a material chosen from AlF$_3$, SiN/SiC, Al$_2$O$_3$, HfAl$_x$O$_y$/SiO$_2$, and AlN with an implantation of F and ZrO$_2$.

The thickness of the protective layer may be between 5 nm and 20 nm.

The protective layer may be made of a material chosen from AlF$_3$, SiN/SiC, Al$_2$O$_3$, HfAl$_x$O$_y$/SiO$_2$, and AlN with an implantation of F and ZrO$_2$.

According to another aspect, a process is presented for producing at least one deep isolation trench, each deep isolation trench being produced between two photodiodes made from a structure comprising a first doped layer and a second doped layer that have a common face, the other face of the second doped layer being in contact with a conducting layer. This process comprises: etching at least one trench through the first doped layer and the second doped layer as far as the conducting layer; conformally depositing a protective layer of a material capable of creating a layer of negative charge at the interface with the silicon in the trench; and conformally depositing an insulator on the protective layer until the trench is filled.

The protective layer may be produced with a thickness of between 5 nm and 20 nm.

The protective layer may be produced from a material chosen from AlF$_3$, SiN/SiC, Al$_2$O$_3$, HfAl$_x$O$_y$/SiO$_2$, and AlN with an implantation of F and ZrO$_2$.

BRIEF DESCRIPTION OF THE DRAWINGS

Other objects, features and advantages will become apparent on reading the following description given solely by way of non-limiting example and with reference to the appended drawings in which.

DETAILED DESCRIPTION OF THE DRAWINGS

Figure 1:
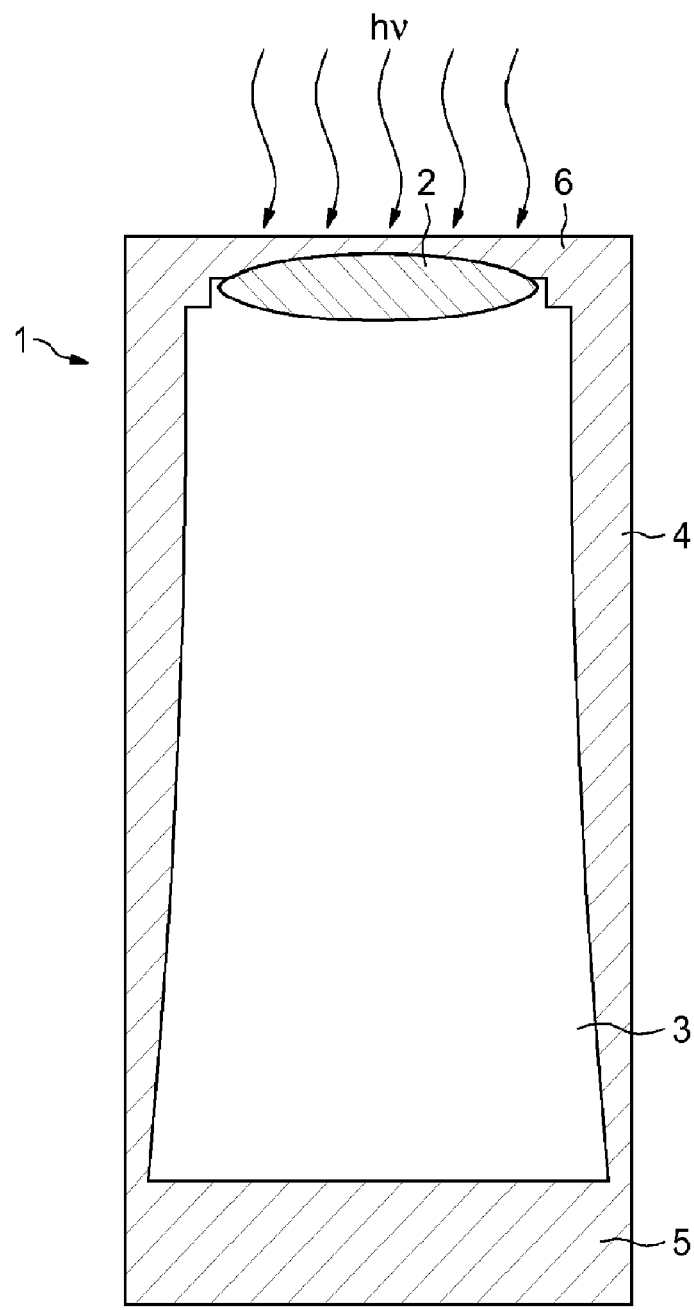
FIG. 1 illustrates the main elements of a photodiode according to the prior art.

FIG. 1 shows a photodiode according to the prior art. The photodiode 1 has an opening on a two-layer stack comprising two layers of opposed doping, forming a diode. A first layer 2 has n-type doping whereas the second layer 3 has p-type doping. A conducting zone 5, which may be a silicon layer, a doped silicon layer or a metal layer, lies beneath the second layer 3.

The photodiode 1 thus described is generally intended to be integrated into a matrix sensor. It is therefore necessary to isolate a given photodiode from the neighboring photodiodes. To do this, deep isolation trenches 4 are formed so as to separate two immediately adjacent photodiodes. The deep isolation trenches (DTIs) 4 are made of an insulating material.

Moreover, the external face of the photodiode is protected from the outside by a passivation layer 6, also made of an insulating material.

A space charge zone, in which the incident electromagnetic radiation may be absorbed, is created at the interface between the first layer 2 and the second layer 3. The absorption then gives rise to the creation of electron-hole pairs. The electrons and holes each migrate in opposite directions under the effect of the electric field in the space charge zone. The displacement of the photogenerated electrons and holes thus gives rise to the creation of a photoelectric current.

As described above, the deep isolation trenches 4 are generally made of an insulator of the oxide or nitride type and have the property of generating a positive charge at the interface with a semiconductor. In the case of the photodiode described in FIG. 1, such a positive charge layer may generate a field sufficient to attract and capture the photogenerated electrons, thus correspondingly reducing the photoelectric current.

Figure 2:
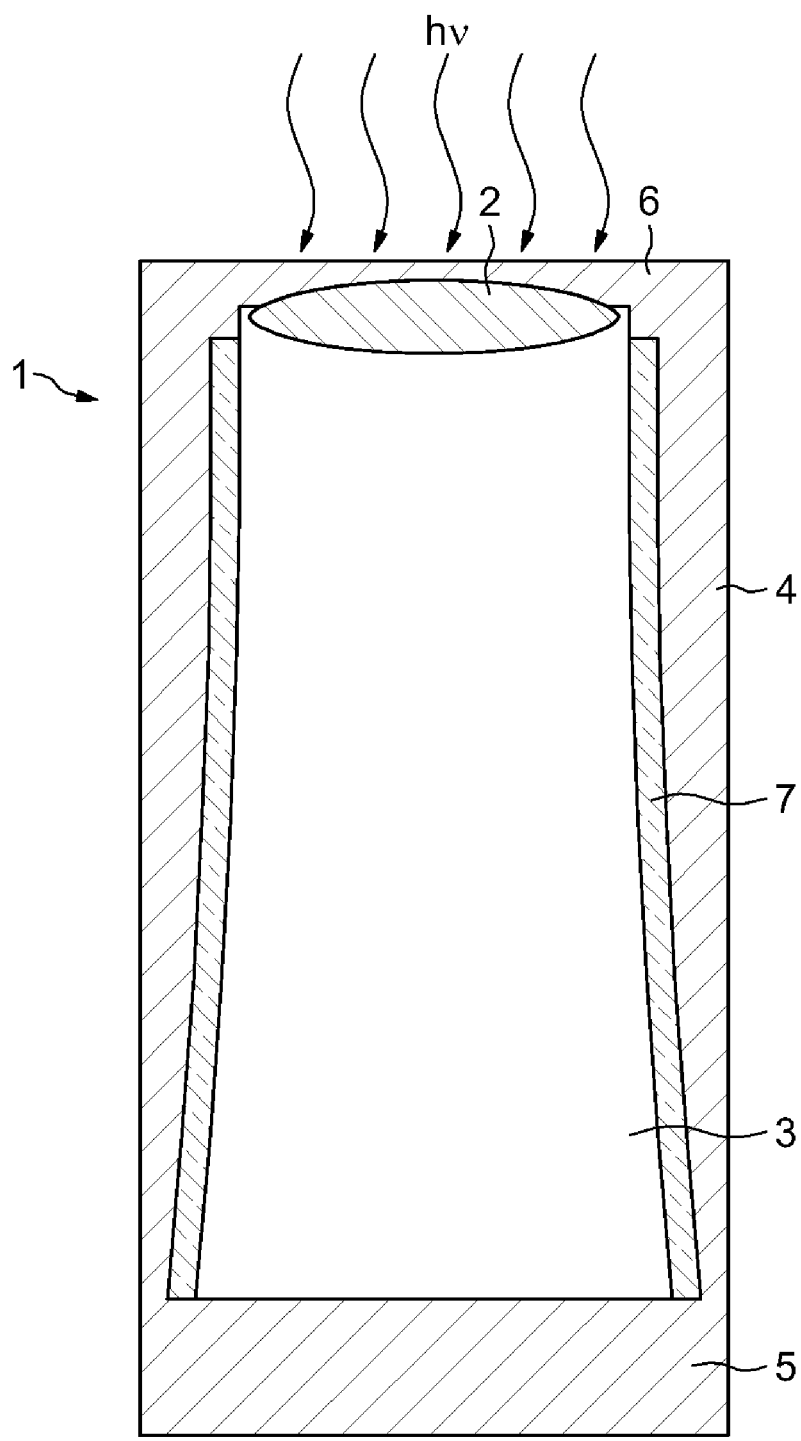
FIG. 2 illustrates the main elements of a photodiode according to a first embodiment.

A first embodiment, illustrated in FIG. 2, includes a protective layer 7. This protective layer makes it possible to create a layer of negative charge at the interface of the trench 4 with the first layer 2 and the second layer 3 so as to repel the photogenerated electrons and reduce the risks of capture.

Figure 3:
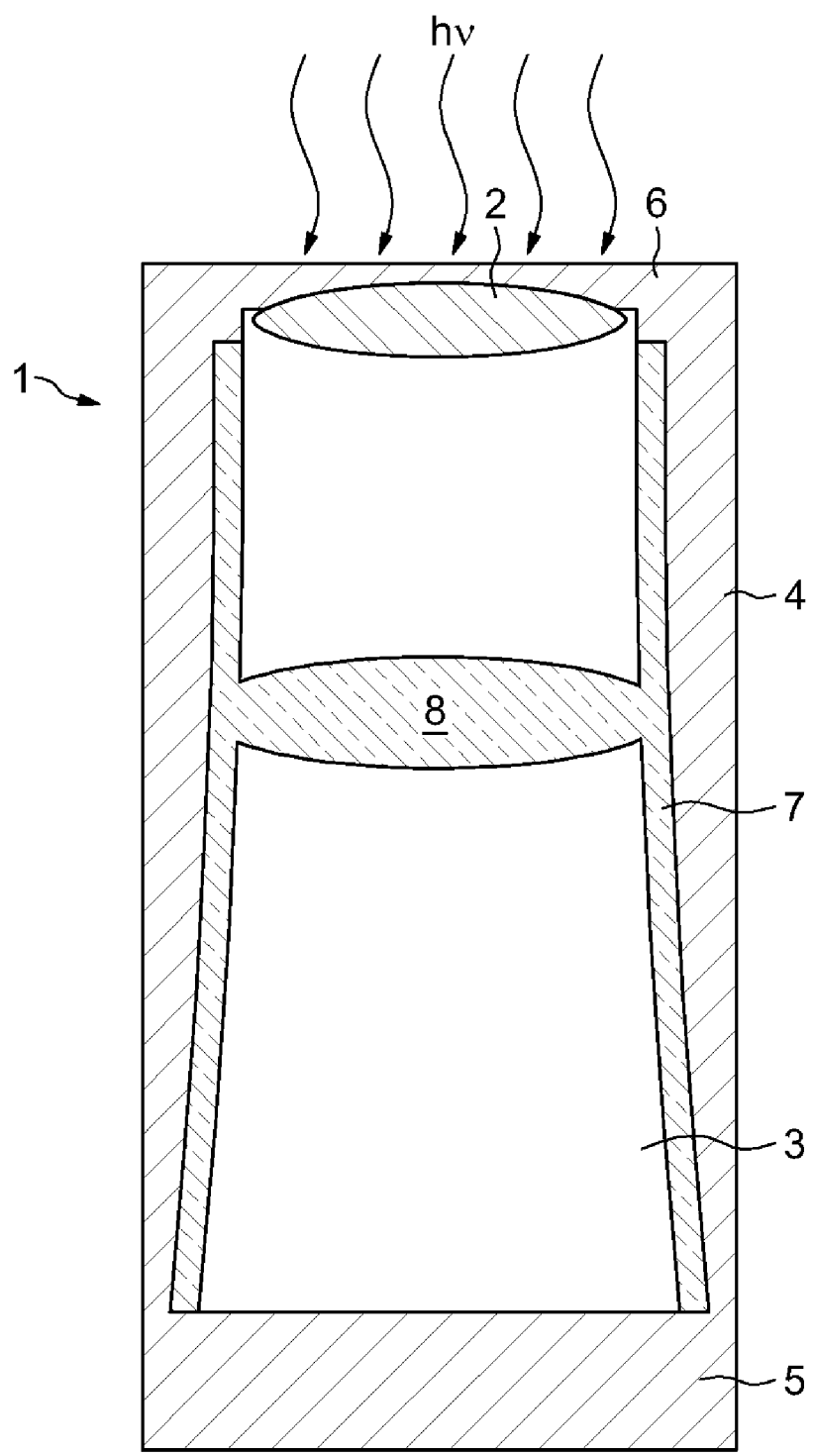
FIG. 3 illustrates the main elements of a photodiode according to a second embodiment.

A second embodiment is illustrated in FIG. 3. The second embodiment includes the formation of an intermediate protective layer 8 made of a material similar to the material employed in the formation of the protective layers 7. Such a layer has several beneficial effects on the performance of the photodiode.

A first effect is to reduce the extent of the space charge zone without reducing the potential difference thereof. This has the effect of increasing the electric field to which the photogenerated electron-hole pairs are subjected. The transit time of the photogenerated electrons and holes is thus reduced and the response time of the photodiode is improved.

A second effect is to act as trap for the photogenerated holes, thus making it possible to increase the sensitivity of the photodiode and reduce the dark current of the photodiode.

However, this second embodiment is dependent on the depth at which the intermediate protective layer 8 has to be implanted. The shorter the wavelength of the incident wave, the closer to the active layer is the point where the photoelectric effect takes place. This means that it is possible to create an intermediate protective layer 8 close to the active zone the shorter the wavelength. In practice, the second embodiment is restricted to photodiodes corresponding to the blue pixels in a red-green-blue system.

The protective layer 7 is made with a thickness of between 5 and 20 nm.

The protective layer 7 is made of a material chosen from $AlF_3$, $SiN/SiC$, $Al_2O_3$, $HfAl_xO_y/SiO_2$, and AlN with an implantation of F and $ZrO_2$.

Figure 4:
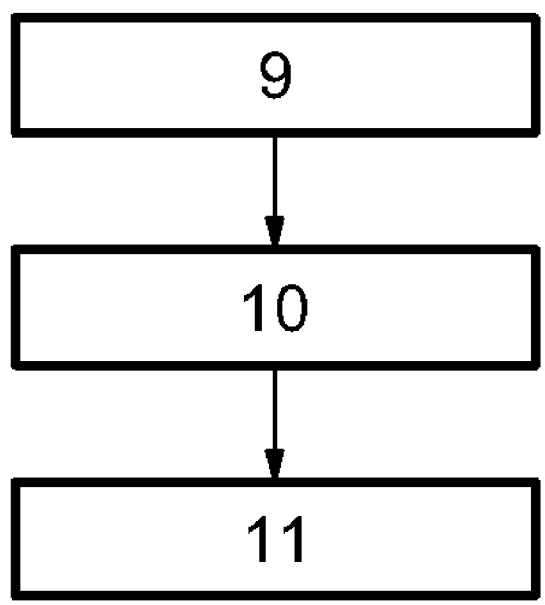
FIG. 4 illustrates the main steps of a method for fabrication a photodiode.

The protective layer 7 is produced during the formation of the deep isolation trench. Deep isolation trenches are used for physically separating the photodiodes arranged in a matrix or for separating a photodiode from its immediate environment. To do this, trenches are produced in the doped silicon forming the first layer 2 and the second layer 3, during an initial step 9 of the method of fabrication (FIG. 4). These trenches may be formed by wet etching, physical etching of the reactive ion etching type, or ion beam milling.

Once the trench has been opened, a first conformal coating is deposited during a subsequent step 10 of the method of fabrication so as to create the protective layer 7. To do this, a material chosen from $AlF_3$, $SiN/SiC$, $Al_2O_3$, $HfAl_xO_y/SiO_2$, and AlN with an implantation of F and $ZrO_2$ is deposited. The coating may be deposited by sputtering, by galvanic deposition or by any appropriate method. The conformal coating makes it possible to obtain a constant thickness of material, thus guaranteeing a constant effect over the entire length of the deep isolation trench. The thickness obtained is between 5 nm and 20 nm.

Next, a layer of insulator, such as silicon dioxide or silicon nitride, is deposited during the next step 11 of the method so as to fill the trench and give it its insulating character. Subsequent process steps may then be carried out, such as the formation of the contact electrodes or the deposition of anti-reflection material.

The production of the second doped layer 3 is stopped when the thickness reached corresponds to the thickness of the portion lying beneath the intermediate protective layer 8. A layer of the same material as the material used for obtaining the protective layer 7 is then deposited. When the desired thickness has been reached, the production of the second doped layer, and more generally of the photodiode, may resume.

The characteristics of a photodiode that includes deep isolation trenches are improved by inserting a protective layer so that a zone of negative charge appears at the interface between the silicon and the deep isolation trench. In addition, an intermediate protective layer may allow the creation of a layer of negative charge at a greater distance from the active zone than the distance between the active zone and the space charge zone. By preventing recombination of the photogenerated electrons, the intermediate protective layer enables the contrast, the dark current and the intensity of the photogenerated current to be improved.

What is claimed is:

1. A photodiode comprising:
   a first doped layer;
   a second doped layer having a common face with the first doped layer;
   at least one deep isolation trench having a face contiguous with the first doped layer and the second doped layer;
   a conducting layer in contact with a free face of the second doped layer; and
   a protective layer configured to generate a layer of negative charge at an interface between, on one side, the first and second doped layers and, on the other side, the deep isolation trench, said protective layer made from a protective material implanted with a material selected from the group consisting of F and $ZrO_2$.

2. The photodiode according to claim 1, wherein the thickness of the protective layer is between 5 nm and 20 nm.

3. The photodiode according to claim 1, wherein the protective material is selected from the group consisting of $AlF_3$, SiN/SiC, $Al_2O_3$, $HfAl_xO_y/SiO_2$, and AlN.

4. A photodiode, comprising:
a first doped layer;
a second doped layer having a common face with the first doped layer;
at least one deep isolation trench having a face contiguous with the first doped layer and the second doped layer;
a conducting layer in contact with a free face of the second doped layer;
a protective layer configured to generate a layer of negative charge at an interface between, on one side, the first and second doped layers and, on the other side, the deep isolation trench; and
an intermediate protective layer at least partly located in the second doped layer, said intermediate protective layer configured to generate a layer of negative charge at an interface with the second doped layer.

5. A process for producing a deep isolation trench for a photodiode made from a structure comprising a first doped layer and a second doped layer sharing a common face, and a conducting layer in contact with a free face of the second doped layer, comprising:
etching at least one trench through the first doped layer and the second doped layer as far as the conducting layer;
conformally depositing in the trench a protective layer of a material providing a layer of negative charge at an interface with first and second doped layers, said material providing a layer of negative charge selected from the group consisting of $AlF_3$, SiN/SiC, $Al_2O_3$ and $HfAl_xO_y/SiO_2$; and
conformally depositing an insulator on the protective layer to fill the trench.

6. The process according to claim 5, wherein the protective layer has a thickness of between 5 nm and 20 nm.

7. The process according to claim 5, wherein the protective layer material is implanted with a material selected from the group consisting of F and $ZrO_2$.

8. A photodiode, comprising:
a first layer of a first conductivity type;
a second layer of a second conductivity type located underneath the first layer;
an isolation trench; and
a protective layer located at an interface between the isolation trench and the first and second layers, the protective layer including doping species configured to provide a layer of negative charge at the interface, said doping species comprising an implantation material selected from the group consisting of F and $ZrO_2$.

9. The photodiode of claim 8, wherein the protective layer is made of a material selected from the group consisting of $AlF_3$, SiN/SiC, $Al_2O_3$, $HfAl_xO_y/SiO_2$, and AlN.

10. A photodiode comprising:
a first layer of a first conductivity type;
a second layer of a second conductivity type located underneath the first layer;
an isolation trench;
a protective layer located at an interface between the isolation trench and the first and second layers, the protective layer including doping species configured to provide a layer of negative charge at the interface; and
an intermediate protective layer passing through the second layer, said intermediate protective layer configured to provide a layer of negative charge within the second layer.

11. The photodiode of claim 10, wherein the protective layer and intermediate protective layer are both made of a material selected from the group consisting of $AlF_3$, SiN/SiC, $Al_2O_3$, $HfAl_xO_y/SiO_2$, and AlN with an implantation of F and $ZrO_2$.

12. A method, comprising:
forming a first doped silicon layer of a first conductivity type;
depositing an intermediate protective layer of a material providing a layer of negative charge at an interface with the first doped silicon layer;
forming a second doped silicon layer of the same first conductivity type overlying the intermediate protective layer;
forming a third doped silicon layer of a second conductivity type overlying the second doped silicon layer;
etching a trench through the second and third doped silicon layers and into at least a portion of the first doped silicon layer;
conformally depositing in the trench a protective layer of a material providing a layer of negative charge at an interface with first through third doped silicon layers; and
depositing an insulator on the protective layer to fill the trench.

13. The process of claim 12, wherein the protective layer and intermediate protective layer are both made of a material selected from the group consisting of $AlF_3$, SiN/SiC, $Al_2O_3$, $HfAl_xO_y/SiO_2$, and AlN with an implantation of F and $ZrO_2$.

14. A method, comprising:
forming a first doped silicon layer of a first conductivity type;
forming a second doped silicon layer of a second conductivity type overlying the first doped silicon layer;
etching a trench through the second doped silicon layer and into at least a portion of the first doped silicon layer;
conformally depositing in the trench a protective layer of a material providing a layer of negative charge at an interface with first and second doped silicon layers, said material providing a layer of negative charge selected from the group consisting of $AlF_3$, SiN/SiC, $Al_2O_3$, and $HfAl_xO_y/SiO_2$; and
depositing an insulator on the protective layer to fill the trench.

15. The process of claim 14, further comprising implanting the protective layer with a material selected from the group consisting of F and $ZrO_2$.

16. The method of claim 14 further comprising:
depositing an intermediate protective layer of a material providing a layer of negative charge at an interface with the first doped silicon layer; and
forming a third doped silicon layer of the same first conductivity type overlying the intermediate protective layer and underneath the second doped silicon layer.

17. The process of claim 16, wherein the protective layer and intermediate protective layer are both made of a material selected from the group consisting of $AlF_3$, SiN/SiC, and $HfAl_xO_y/SiO_2$.

18. The photodiode according to claim 4, wherein the protective layer and intermediate protective layer are made of a material selected from the group consisting of $AlF_3$, SiN/SiC, $Al_2O_3$, $HfAl_xO_y/SiO_2$, and AlN with an implantation of F and $ZrO_2$.

* * * * *